US008749255B2

(12) United States Patent
Takeda et al.

(10) Patent No.: US 8,749,255 B2
(45) Date of Patent: Jun. 10, 2014

(54) ELECTRONIC DEVICE TEST APPARATUS

(75) Inventors: Yasuhide Takeda, Saitama (JP);
Hiroyuki Nagai, Saitama (JP); Yoji Ogino, Saitama (JP); Tatsuya Yamada, Saitama (JP)

(73) Assignee: Advantest Corporation, Tokyo (JP)

( * ) Notice: Subject to any disclaimer, the term of this patent is extended or adjusted under 35 U.S.C. 154(b) by 312 days.

(21) Appl. No.: 13/018,726

(22) Filed: Feb. 1, 2011

(65) Prior Publication Data

US 2011/0248734 A1    Oct. 13, 2011

(30) Foreign Application Priority Data

Feb. 5, 2010   (JP) .................................. 2010-024164

(51) Int. Cl.
*G01R 31/00*   (2006.01)
*G01R 31/26*   (2014.01)

(52) U.S. Cl.
USPC ............ 324/750.03; 324/750.05; 324/756.05; 438/14

(58) Field of Classification Search
CPC . G01R 1/06761; G01R 1/0491; G01R 1/0441
USPC ....................................................... 324/750.03
See application file for complete search history.

(56) References Cited

U.S. PATENT DOCUMENTS

| 6,392,866 B1* | 5/2002 | Dinteman ...................... 361/206 |
| 6,563,331 B1* | 5/2003 | Maeng ...................... 324/750.05 |
| 6,856,128 B2* | 2/2005 | Ito et al. .................... 324/750.13 |
| 7,262,615 B2* | 8/2007 | Cheng et al. .............. 324/756.05 |
| 2001/0038295 A1* | 11/2001 | Kim et al. ...................... 324/765 |
| 2002/0163065 A1 | 11/2002 | Kuwahara et al. |
| 2005/0162150 A1 | 7/2005 | Nakamura |
| 2007/0141731 A1* | 6/2007 | Hemink et al. .................. 438/14 |
| 2008/0038098 A1* | 2/2008 | Ito et al. .................... 414/222.01 |
| 2009/0126468 A1 | 5/2009 | Hideno et al. |
| 2009/0189631 A1 | 7/2009 | Shimada et al. |
| 2009/0278559 A1* | 11/2009 | Inoue et al. .................... 324/754 |
| 2010/0102837 A1 | 4/2010 | Abe et al. |
| 2011/0128031 A1 | 6/2011 | Watanabe et al. |

FOREIGN PATENT DOCUMENTS

| JP | 7-201428 | 8/1995 |
| JP | 9-045442 | 2/1997 |
| JP | 10-213627 | 8/1998 |

(Continued)

OTHER PUBLICATIONS

Korea Office action, mail date is Mar. 7, 2012.

(Continued)

*Primary Examiner* — Jermele M Hollington
*Assistant Examiner* — Christopher McAndrew
(74) *Attorney, Agent, or Firm* — Greenblum & Bernstein P.L.C.

(57) ABSTRACT

An electronic device test apparatus which can optimize throughput and costs is provided.
An electronic device test apparatus 1 comprises: a test cell cluster 10 having cell groups 11A to 11H each of which has a plurality of test cells 20; and a conveyor apparatus 30 supplying test carriers to a plurality of the test cells 20, and each of the test cell 20 has: contactors 215; a flow path 221 connected to a vacuum pump 25 and reducing pressure in a recess 211 of a pocket 21 so as to bring external terminals 73 and the contactors 215 into contact; and a test circuit for running a test on an electronic circuit formed into a die 90.

23 Claims, 22 Drawing Sheets

(56) References Cited

FOREIGN PATENT DOCUMENTS

| | | |
|---|---|---|
| JP | 10-340937 | 12/1998 |
| JP | 11-148964 | 6/1999 |
| JP | 2002-257900 A | 9/2002 |
| JP | 2002-328150 | 11/2002 |
| JP | 2003-337156 | 11/2003 |
| JP | 2003-338194 | 11/2003 |
| JP | 2004-192712 | 7/2004 |
| JP | 2006-173503 A | 6/2006 |
| KR | 10-2004-0111539 | 12/2004 |
| WO | 2009/147723 | 12/2009 |

OTHER PUBLICATIONS

Japan Office action, mail date is Aug. 13, 2013.

* cited by examiner

ELECTRONIC DEVICE TEST APPARATUS

TECHNICAL FIELD

The present invention relates to an electronic device test apparatus for testing electronic devices provisionally mounted in test carriers.

BACKGROUND ART

As a test apparatus for testing integrated circuits formed into a semiconductor wafer, an apparatus comprising a probe card for bringing a large number of pad electrodes on the semiconductor wafer into contact with bumps all at once is known (for example, see PLT 1).

Further, as a test apparatus for testing packaged semiconductor devices, an apparatus simultaneously bringing a large number of semiconductor devices into contact with sockets is known (for example, see PLT 2).

CITATION LIST

Patent Literature

PLT 1: Japanese Patent Publication (A) No. 2006-173503
PLT 2: Japanese Patent Publication (A) No. 2002-257900

SUMMARY OF INVENTION

Technical Problem

In the above test apparatus, all of the devices are brought into contact with the probe card or sockets all together, so the throughput is high, but a plurality of test apparatuses are required for running a plurality of types of tests, so there was the problem that the cost became higher.

The problem to be solved by the present invention is the provision of an electronic device test apparatus which can optimize the throughput and costs.

Solution to Problem

[1] The electronic device test apparatus according to the present invention is an electronic device test apparatus for testing electronic devices temporarily mounted in test carriers, the apparatus comprising: a plurality of test cell groups each of which has a plurality of test cells and; a conveying means for conveying the test carriers to a plurality of the test cells, wherein each of the test cells has: contact terminals; a contacting means for bringing external terminals of the test carrier and the contact terminals into contact, and a test circuit for running a test on the electronic device.

[2] In the above invention, each of the test cell groups may be configured by a plurality of the test cells arranged in a matrix.

[3] In the above invention, a plurality of the test cell groups may be arranged so as to face each other via the conveying means.

[4] In the above invention, a plurality of the test cells may at least include; first test cells having first test circuits for running a first test; and second test cells having second test circuits for running a second test with a longer test time than the first test.

[5] In the above invention, a plurality of the test cells may include a larger number of the second test cells than the first test cells.

[6] In the above invention, part of the test cells among a plurality of the test cells may have recovery-use circuits for cutting electric fuses of the electronic devices instead of the test circuits.

[7] In the above invention, each of the test circuits may be able to run a plurality of types of tests.

[8] In the above invention, the conveying means may have: a circulating conveying means for circulating and conveying the electronic devices; and moving means for moving the electronic devices between the circulating conveying means and the test cells.

[9] In the above invention, the conveying means may have a circulating conveying means for circulating and conveying the electronic devices, and each of the test cells may have a moving means for moving the electronic devices from the circulating conveying means.

[10] In the above invention, the circulating conveying means may have a plurality of conveyance paths.

[11] In the above invention, the contacting means may include a pressure reducing means for reducing pressure in a space between a board on which the contact terminals are mounted and a test carrier so as to bring the contact terminals and the external terminals into contact.

[12] In the above invention, the contacting means may include a pushing means for pushing a test carrier toward the contact terminals so as to bring the contact terminals and the external terminals into contact.

[13] In the above invention, the electronic device test apparatus may comprises a control means for controlling the plurality of the test cells and the conveying means.

[14] In the above invention, the control means may control a plurality of the test cells so that a plurality of the test cells run tests independently from each other.

[15] In the above invention, each of the test cells may have a temperature adjusting means for adjusting the temperature of the electronic device, and the control means may control a plurality of the test cells so that a plurality of the test cells adjust the temperatures of the electronic devices independently from each other.

[16] In the above invention, the control means may control the conveying means so as to successively convey the same electronic device to a plurality of the test cells.

[17] In the above invention, the control means may control the conveying means so as not to supply an electronic device judged defective at one of test cells to other of the test cells.

[18] In the above invention, the control means may search for empty test cells to which test carriers are not supplied and may control the conveying means so as to preferentially supply the test carriers to the empty test cells.

[19] In the above invention, the control means may control the conveying means so as to start the supply of the test carriers to the test cells on the basis of the remaining test times at the test cells under test.

[20] In the above invention, the electronic device test apparatus may comprise buffers for temporarily storing the electronic devices, which are to be supplied to the test cells, between the conveying means and the test cells.

[21] In the above invention, the electronic device test apparatus may comprises a control means for controlling a plurality of the test cells and the conveying means, and the control means may search for empty buffers not storing the test carriers and control the conveying means so as to preferentially supply the test carriers to the empty buffers.

[22] In the above invention, at least part of the test cells among the plurality of the test cells may have: a plurality of the test circuits; and switching means for switching the test circuits to be electrically connected to the contact terminals from among the plurality of the test circuits.

[23] In the above invention, at least part of the test cells among a plurality of the test cells may have sockets to which the test circuits are able to be attached and detached.

[24] In the above invention, each of the test carriers may comprise: a base member having the external terminals and on which the electronic device is to be placed; and a cover member which is covered over the base member, at least one of the base member or the cover member may have a film-shaped member, and the electronic device is sandwiched between the base member and the cover member under a pressure reduced from atmospheric pressure.

[25] In the above invention, the electronic device may be a die which is formed by dicing a semiconductor wafer.

Advantageous Effects of Invention

In the present invention, test carriers in which electronic devices are temporarily mounted are conveyed by a conveying means to the test cells, and the test cells individually test the electronic devices, so it is possible to optimize the throughput and costs.

DESCRIPTION OF EMBODIMENTS

Below, embodiments of the present invention will be explained on the basis of the drawings.

Figure 1:
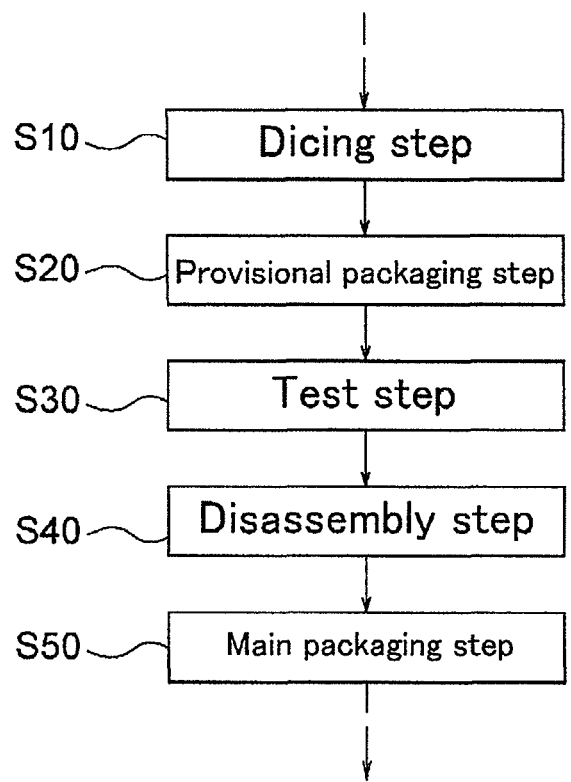
FIG. 1 is a flowchart showing part of the process of production of a device in an embodiment of the present invention.

FIG. 1 is a flowchart showing part of the process of production of a device in the present embodiment.

In the present embodiment, after dicing the semiconductor wafer (after step S10 of FIG. 1) and before the final packaging (before step S50), the integrated circuits and other electronic circuits formed into each die 90 are tested (steps S20 to S40). In the present embodiment, first, a carrier assembly apparatus (not shown) is used to temporarily mount the die 90 on a test carrier 60 (step S20). Next, the die 90 and a test circuit 23 of an electronic device test apparatus 1 (see FIG. 8) are electrically connected through this test carrier 60 so as to test the electronic circuits which are formed into the die 90 (step S30). Further, after this test ends, the die 90 is taken out from the test carrier 60 (step S40), then this die 90 is finally packaged whereby the device is completed as a final product (step S50).

First, the configuration of the test carrier 60 in which the die 90 is temporarily mounted (provisionally packaged) for testing in the present embodiment will be explained.

Figure 4:
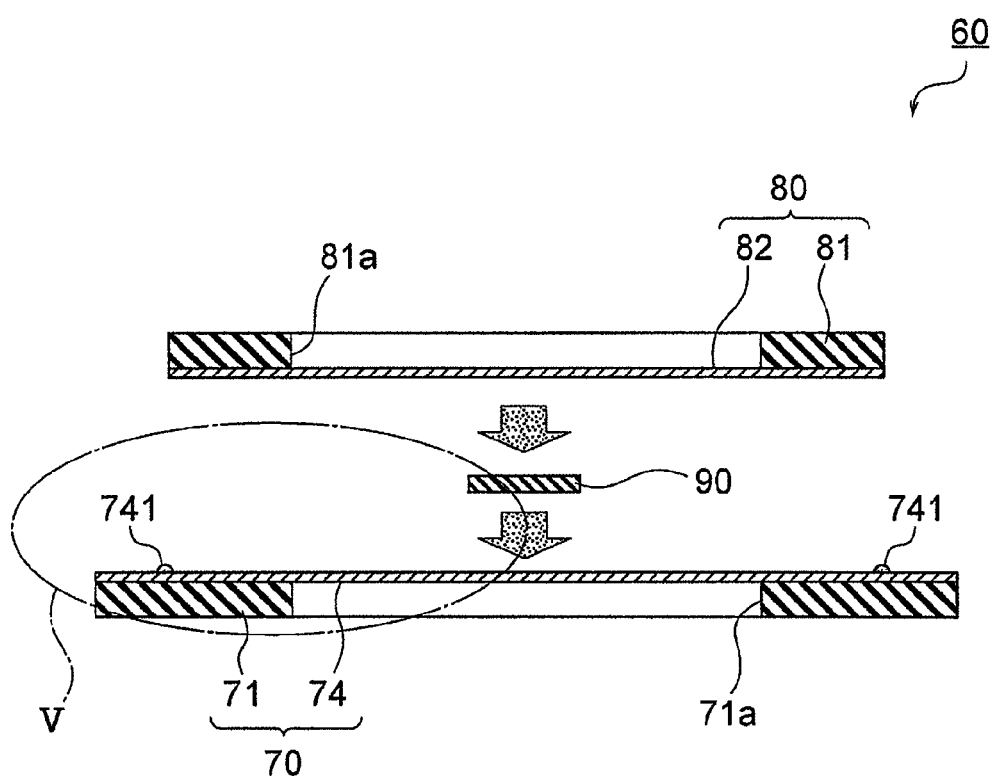
FIG. 4 is a disassembled perspective view of a test carrier in an embodiment of the present invention.
Figure 5:
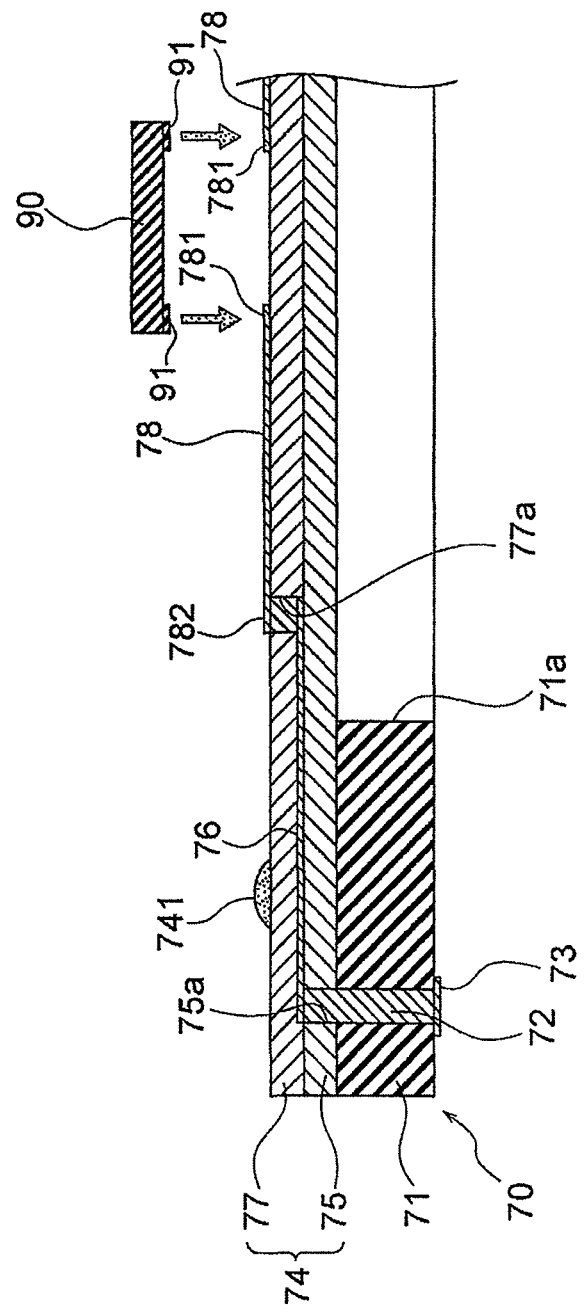
FIG. 5 is an enlarged view of a part V of FIG. 4.
Figure 6:
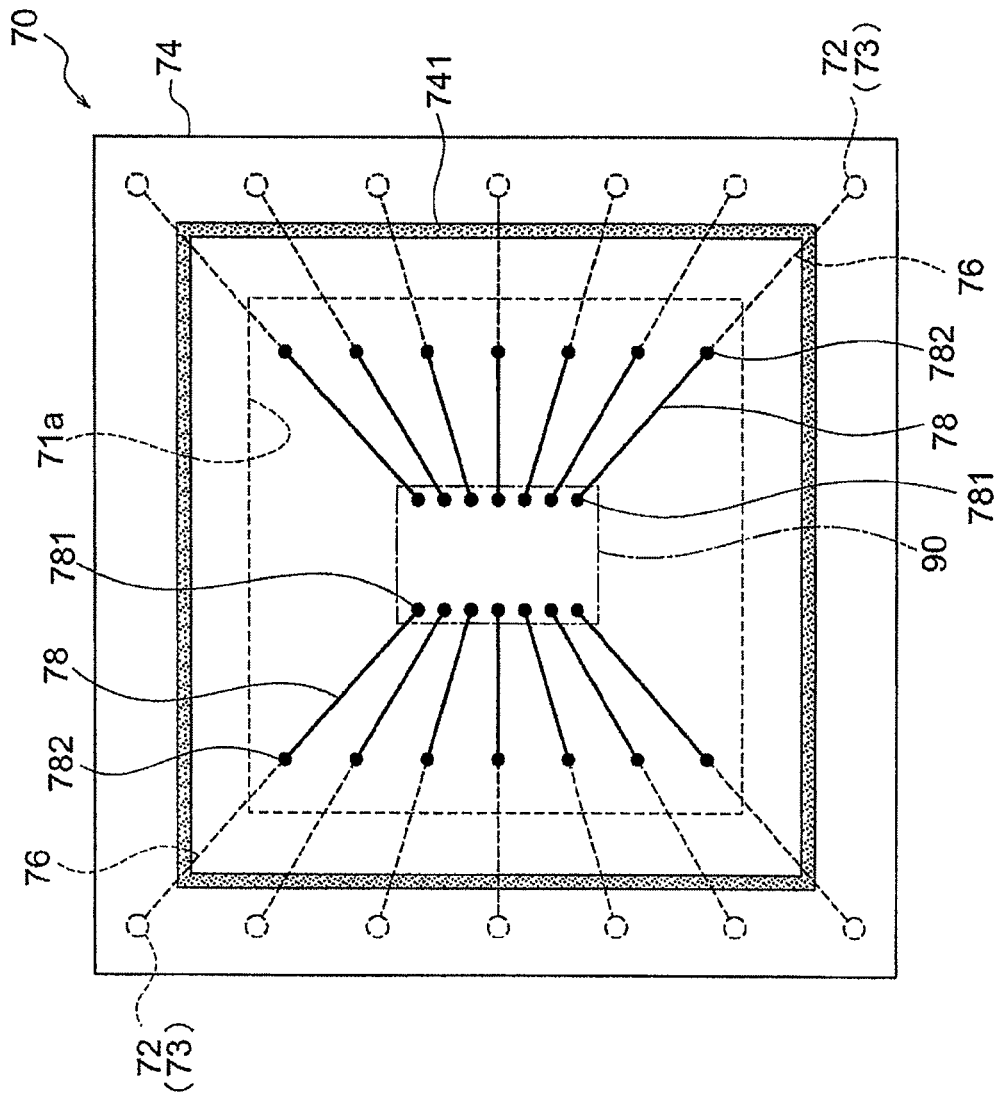
FIG. 6 is a plan view showing a base member of a test carrier in an embodiment of the present invention.

FIG. 2 to FIG. 5 are views showing a test carrier in the present embodiment, while FIG. 6 is a plan view showing a base member of the test carrier.

Figure 2:
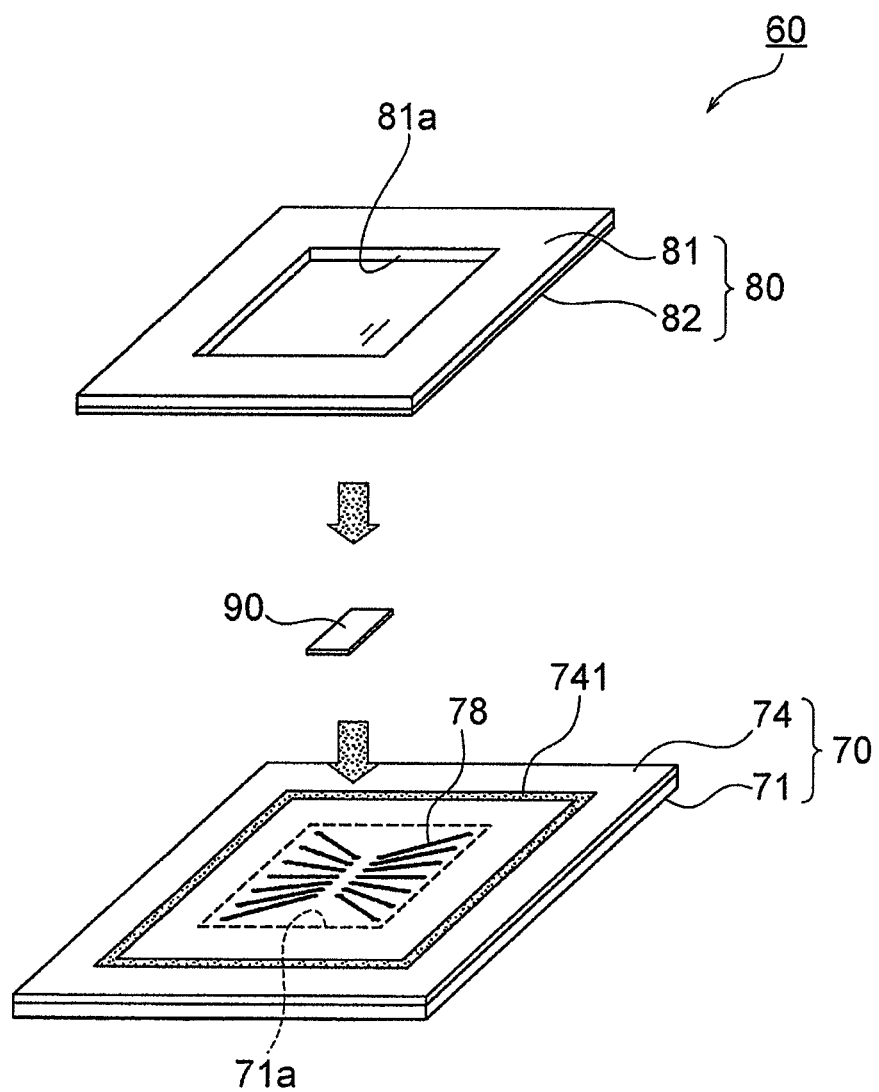
FIG. 2 is a disassembled perspective view of a test carrier in an embodiment of the present invention.
Figure 3:
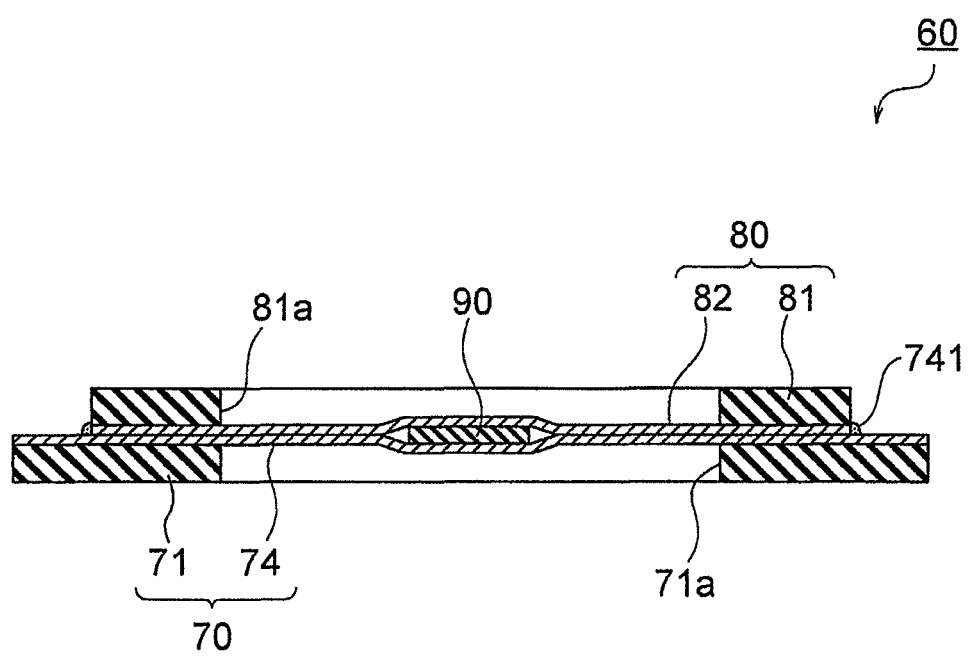
FIG. 3 is a cross-sectional view of a test carrier in an embodiment of the present invention.

The test carrier 60 in the embodiment, as shown in FIG. 2 to FIG. 4, comprises: a base member 70 on which interconnect patterns 76 and 78 (see FIG. 5 and FIG. 6) are formed and on which a die 90 is to be mounted; and a cover member 80 which is covered over this base member 70. This test carrier 60 holds the die 90 by sandwiching the die 90 between the base member 70 and the cover member 80 under a pressure reduced from atmospheric pressure.

The base member 70 comprises: a rigid board 71 at the center of which an opening 71a is formed; and a flexible board 74 which is laminated over the entire surface of the rigid board 71 including the center opening 71a. This flexible board 74 is designed to be able to deform at its center, while is designed to not be able to deform at the outer circumference due to the rigid board 71.

As a specific example of the rigid board 71, for example, a single-layer board or a multiple-layer board etc. composed of a polyamide-imide resin or ceramic, glass, etc. may be mentioned. On the other hand, as a specific example of the flexible board 74, for example, a single layer board or a multiple-layer board etc. composed of a polyimide resin may be mentioned.

The flexible board 74, as shown in FIG. 5, has: a base film 75 on which second interconnect patterns 76 are formed; and a coverlay 77 covering this base film 75.

The second interconnect patterns 76 shown in FIG. 5 and FIG. 6, for example, are formed in advance by etching copper foil laminated on the base film 75. On the other hand, first interconnect patterns 78 are formed on the surface of the coverlay 77 by ink jet printing. The first interconnect patterns 78 are printed in real time by an interconnect-forming module (not shown) right before mounting the die 90 on the base member 70.

One end of each first interconnect pattern 78 is connected to one end of a second interconnect pattern 76 through a through hole 77a which is formed in the coverlay 77. On the other hand, a pad 781 to which a terminal 91 of the die 90 is connected is formed at the other end of the first interconnect pattern 78.

A through hole 72 penetrates a position of the rigid board 71 corresponding to the other end of each second interconnect pattern 76. The second interconnect pattern 76 is connected to the through hole 72 through a through hole 75a is which formed in the base film 75. This through hole 72 is connected to an external terminal 73 which is formed on the bottom surface of the rigid board 71. When the electronic circuits which is formed into the die 90 is tested, a contactor 215 of a test cell 20 explained later contacts with this external terminal 73.

Note that, the other end of the second interconnect pattern 76 may be positioned at the inside of the center opening 71a of the rigid board 71 so as to form the external terminal 73 on the back surface of the flexible board 74. Further, the other end of the second interconnect pattern 76 may be exposed at the top side so as to form the external terminal 73 on the top surface of the flexible board 74.

As shown in FIG. 2 to FIG. 4, the cover member 80 comprises: a rigid board 81 at the center of which an opening 81a is formed; and a film 82 which is laminated on the rigid board 81. The film 82 is designed to be able to deform at the center part, while is designed not to be able to be deformed at the outer circumference due to the rigid board 81.

As a specific example of the rigid board 81, for example, a board-shaped member composed of a polyamide-imide resin, ceramic, glass, etc. may be mentioned. On the other hand, as a specific example of the film 82, for example, a sheet-shaped member made of a polyimide resin may be mentioned.

Note that, it is possible for the cover member 80 to include just the film 82 or possible for the cover member 80 to include just the rigid board 81 with no opening 81a. Further, when the cover member 80 has the film 82, the base member 70 may include just the rigid board 71. In this case, the rigid board 71 is not formed with the opening 71a, and the first and second interconnect patterns 76 and 78 are formed on the rigid board 71.

Furthermore, in the present embodiment, any interconnect patterns are not formed on the cover member 80, but the invention is not particularly limited to this. Instead of the base member 70 or in addition to the base member 70, interconnect patterns may be formed on the cover member 80. In this case, instead of the rigid board 81, in the same way as the above-mentioned rigid board 71, for example, a single-layer board or a multiple-layer board etc. composed of a polyamide-imide resin or ceramic, glass, etc. may be used. Further, instead of the film 82, in the same way as the above-mentioned flexible board 74, for example, a single-layer board or a multiple-layer board etc. composed of for example a polyimide resin may be used.

The above explained test carrier 60 is assembled as follows. That is, the die 90 is placed on the base member 70 in the state where the terminals 91 are aligned with the pads 781, then the cover member 80 is placed on the base member 70 under reduced pressure. Next, the pressure is returned to atmospheric pressure in the state where the die 90 is sandwiched between the base member 70 and the cover member 80, whereby the die 90 is held between the base member 70 and the cover member 80.

Note that, the terminals 91 of the die 90 and the pads 74 of the flexible board 74 are not fastened by solder etc. In the present embodiment, the space between the base member 70 and the cover member 80 becomes a negative pressure in comparison with atmospheric pressure, so the flexible board 74 and the film 82 press the die 90 so as to contact the terminals 91 of the die 90 and pads 781 of the flexible board 74 each other.

Incidentally, when the die 90 is relatively thick, by reversing the constitution shown in FIG. 3, the base member 70 and the cover member 80 may be stacked so that the rigid board 71 and the rigid board 81 directly contact each other.

As shown in FIG. 2 to FIG. 6, the base member 70 and the cover member 80 are fastened to each other by the bonding part 71 in order to prevent from offset and improve in sealability. As the adhesive forming this bonded part 741, for example, a UV curing type adhesive may be mentioned. The adhesive is in advance applied to the base member 70 at positions facing the outer circumference of the cover member 80. The adhesive is cured by UV irradiation after the base member 70 is covered with the cover member 80, whereby the bonded part 741 is formed.

Next, the electronic device test apparatus 1 which is used in the tests (step S30 of FIG. 1) of the dies provisionally packaged in the test carriers 60 will be explained.

Figure 7:
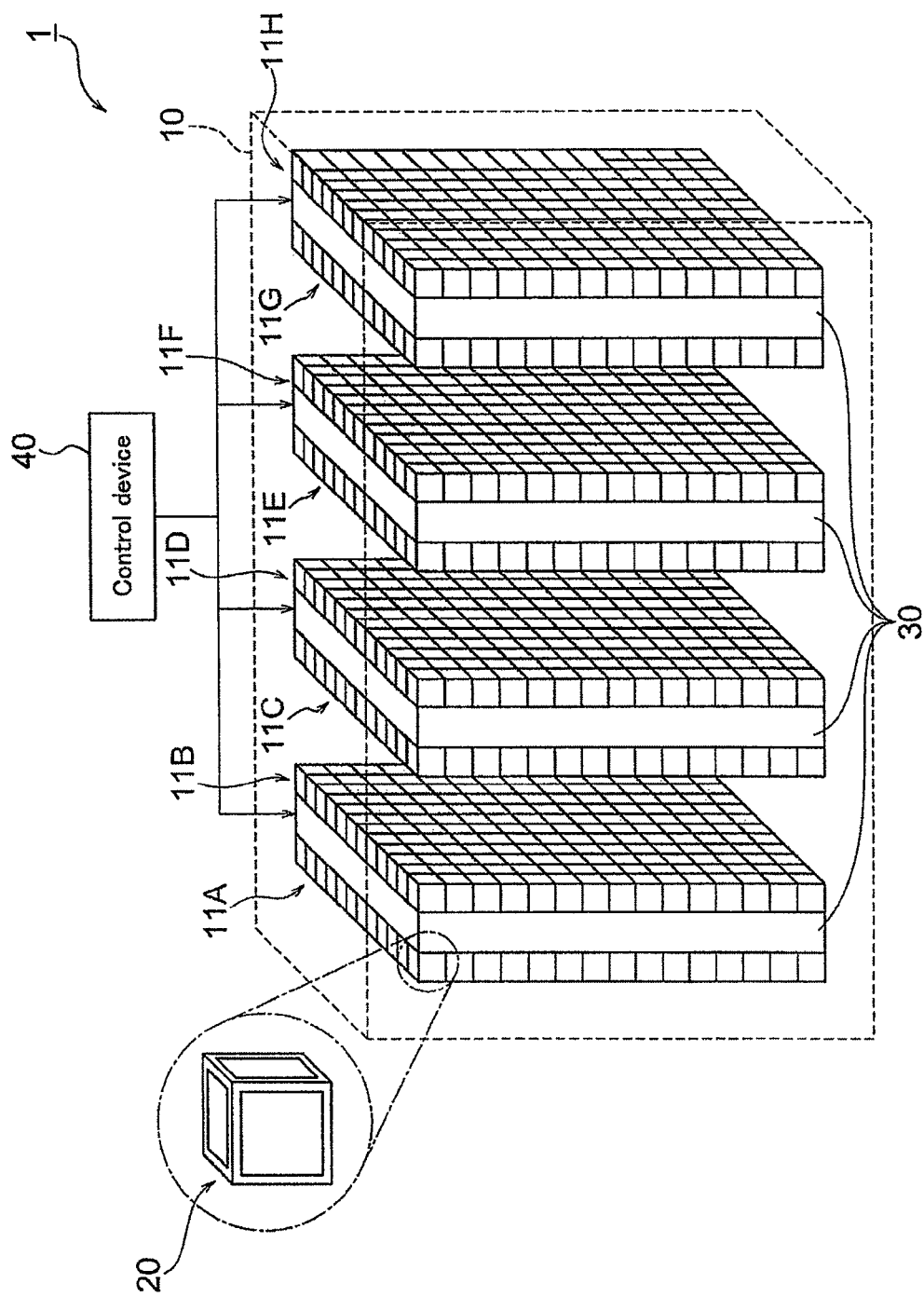
FIG. 7 is a schematic perspective view showing the overall configuration of an electronic device test apparatus in an embodiment of the present invention.

FIG. 7 is a schematic perspective view showing the overall configuration of an electronic device test apparatus in the present embodiment.

The electronic device test apparatus 1 in the present embodiment is a test apparatus which tests dies (electronic devices) 90 provisionally packaged in the above-mentioned test carriers 60. This electronic device test apparatus 1, as shown in FIG. 7, comprises: a test cell cluster 10 having groups of large numbers of test cells 20; a conveyor apparatus 30 which conveys test carriers 60 to the test cells 20; and a control device 40 which controls the test cells 20 and conveyor apparatus 30.

The test cell cluster 10, as shown in the same figure, comprises a plurality (in this example, eight) cell groups 11A to 11H. Each of the cell groups 11A to 11H respectively has large numbers of (in the present example, 180) test cells 20. In the present embodiment, 180 test cells 20 are arranged in a matrix of 15 rows and 12 columns in each of the cell groups 11A to 11H.

Note that, the number of cell groups which the test cell cluster has and the numbers of test cells which each of the cell groups has are not particularly limited to the above. Further, the array of cell groups which the test cell cluster has and the array of test cells which each of the cell groups has are also not particularly limited. Furthermore, in the present embodiment, all of the cell groups 11A to 11H have the same number and same array of test cells 20, but the invention is not particularly limited to this. The number and array of test cells may also be different between the cell groups.

Figure 8:
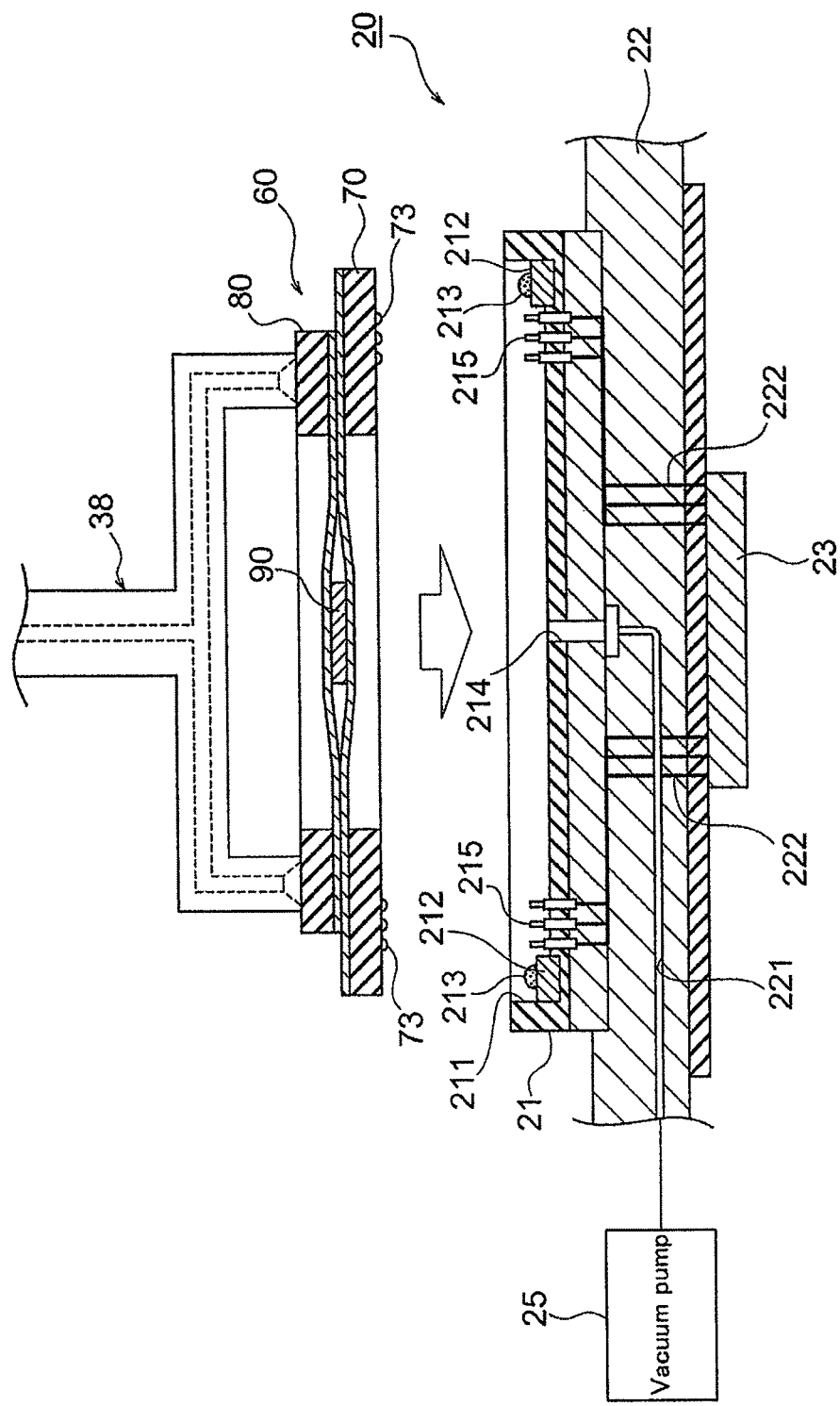
FIG. 8 is a cross-sectional view showing a movement apparatus and test cell in an embodiment of the present invention.
Figure 9:
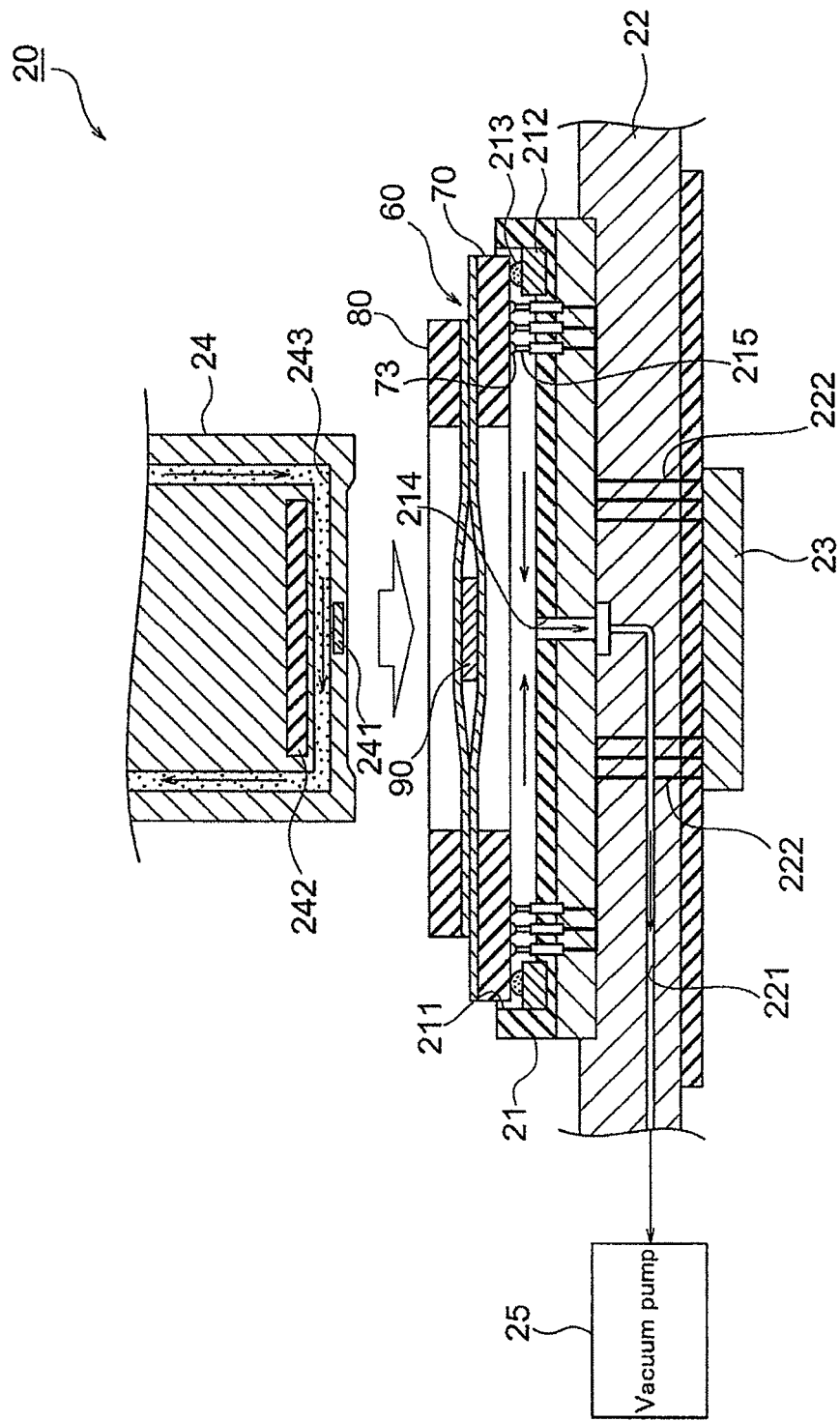
FIG. 9 is a cross-sectional view showing a test cell in an embodiment of the present invention.
Figure 10:
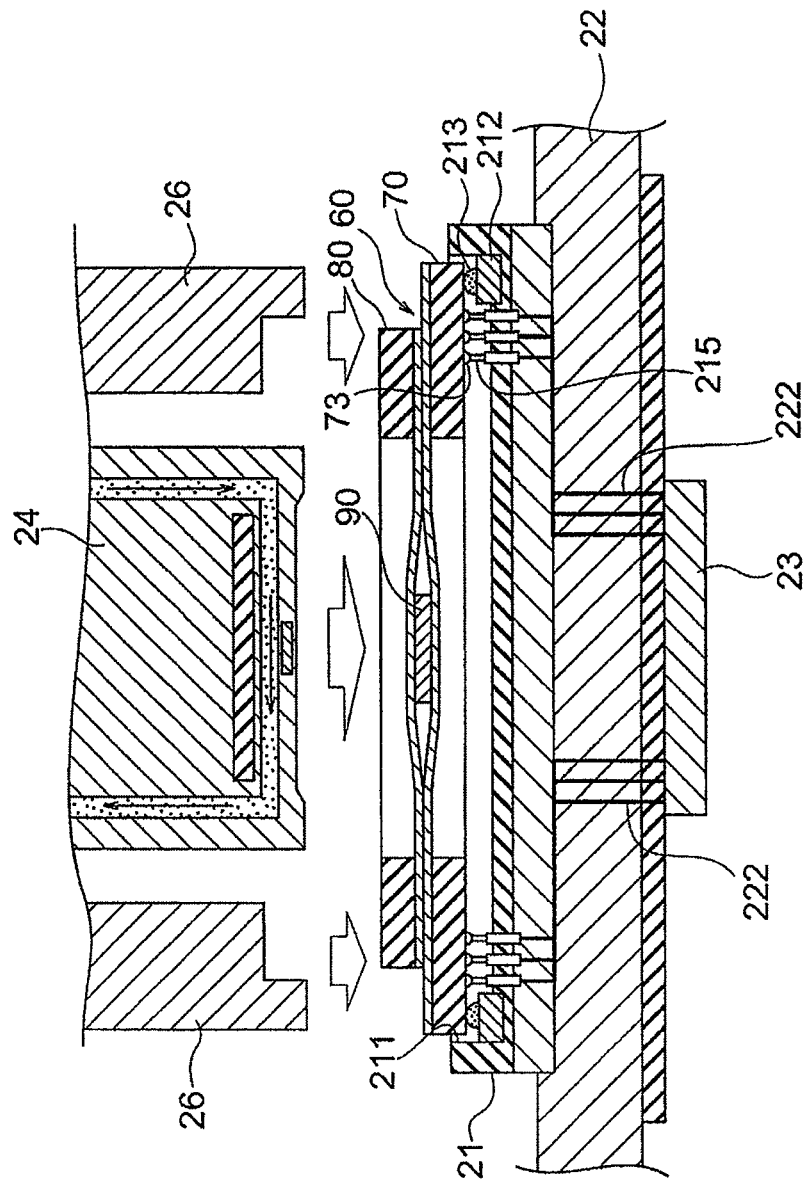
FIG. 10 is a cross-sectional view showing a first modification of a test cell in an embodiment of the present invention.
Figure 11:
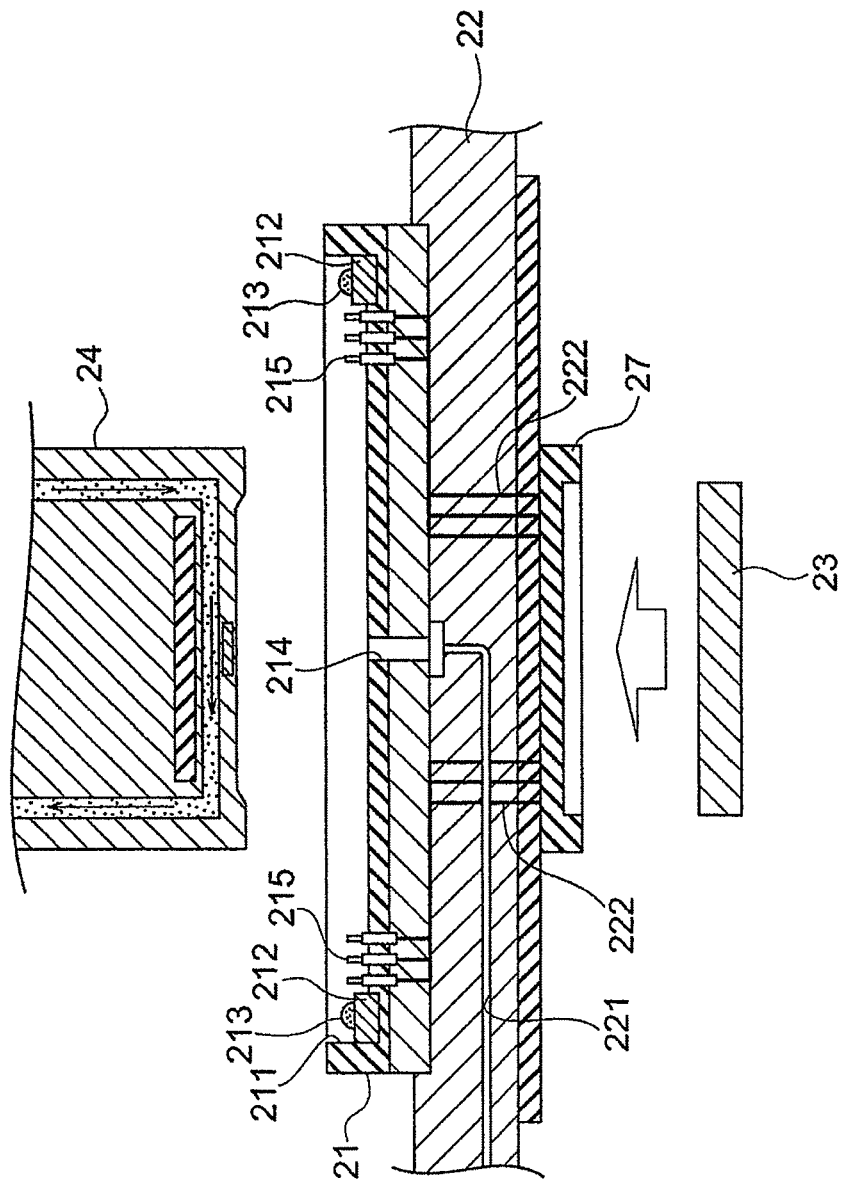
FIG. 11 is a cross-sectional view showing a second modification of a test cell in an embodiment of the present invention.
Figure 12:
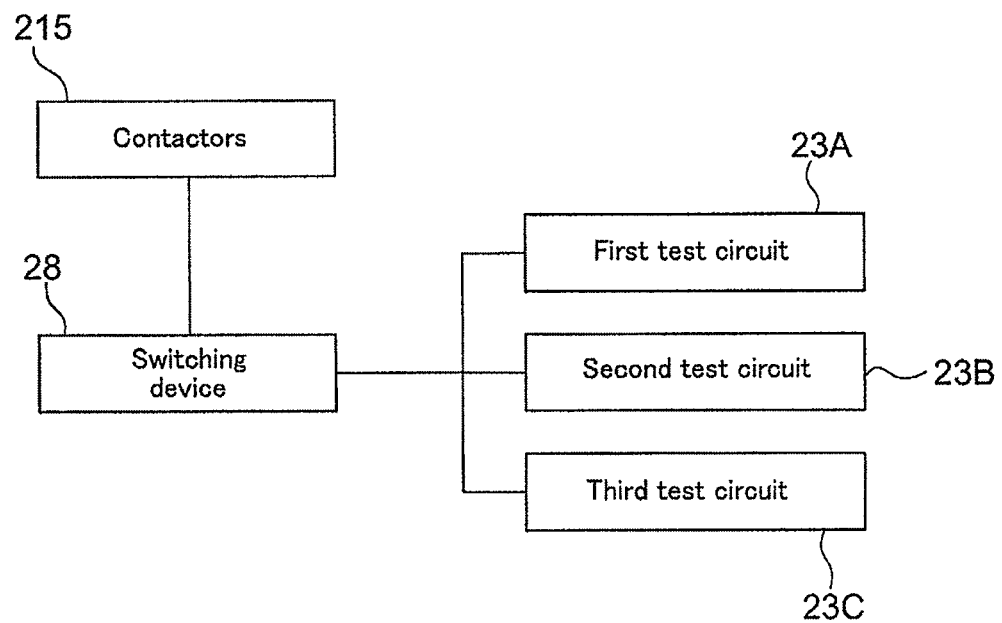
FIG. 12 is a block diagram showing a third modification of a test cell in an embodiment of the present invention.

FIG. 8 is a cross-sectional view showing a movement apparatus and test cell in the present embodiment, FIG. 9 is a cross-sectional view showing a test cell in the present embodiment, and FIG. 10 to FIG. 12 are views showing modifications of the test cell in the present embodiment.

Each test cell 20, as shown in FIG. 8 and FIG. 9, comprises a pocket 21, a board 22, a test circuit 23, and a temperature adjustment head 24.

The pocket 21 has a recess 211 which is able to hold a test carrier 60. A stopper 212 which comprises a seal member 213 at its top is provided on the outer circumference of this recess 211 over the entire circumference. As the seal member 213, for example, rubber packing etc. may be used. When the outer circumference of the test carrier 60 abuts against the seal member 213, the recess 211 is shut tight.

The pocket 21 is mounted on the board 22 and has a suction port 214 opened at the substantial center of the pocket 21. This suction port 214 is connected to a vacuum pump 25 through a communication path 221 formed inside the board 22.

Further, for example, POGO pin or other contactors 215 are arranged inside the recess 211 so as to correspond to the external terminals 73 of the test carrier 60. The contactors 215 are electrically connected to a test circuit (tester chip) 23 mounted on the back surface of the board 22 through interconnect patterns 222 formed in the board 22. Note that, the test circuit 23 may also be mounted on the top surface of the board 22. In this case, the test circuit 23 is arranged at the side of the pocket 21.

The test circuit in the present embodiment is a chip having the function of testing the electronic circuits formed into a die 90 and is a one-chip tester comprising the functions of a conventional tester. A conventional tester tests a plurality of devices by a single unit, while in the present embodiment, a single test circuit 23 is used to test a single die 90. That is, in the present embodiment, each of the test cells 20 has one test circuit 23, and a plurality of test cells 20 are able to run tests on a plurality of dies 90 simultaneously and independently. Note that, the test circuit 23 is not limited to being configured by a single chip so long as of a type able to be accommodated in a test cell 20. For example, it may also be configured by an MCM (multi-chip module) etc. Further, a single test circuit 23 may test a plurality of dies 90.

As specific examples of tests run by this test circuit 23, for example, a DC test, core test, speed test, etc. may be mentioned. In a DC test, for example, the input/output voltage, leak current, etc. are evaluated. In a core test, for example, whether all bits of a memory are functioning normally is evaluated. Further, in a speed test, for example, whether a device functions normally at the actual speed is evaluated. Incidentally, since all bits are tested in a core test, the its test time is much larger than a DC test or speed test. Note that, the tests which the test circuits 23 run are not limited to the above three types.

In the present embodiment, the test circuit 23 may be a specialized chip for running only one test among a DC test, core test, or speed test or may be a general use chip where a single test circuit 23 can run all three types of tests, but a specialized chip like the former limited in function enables the costs to be reduced.

The temperature adjustment head 24, as shown in FIG. 9, has a temperature sensor 241 and a heater 242 embedded in it and is formed with a flow path 243 in which a refrigerant can flow. This flow path 243 is connected to a not shown chiller. This temperature adjustment head 24 is designed to be able to approach/separate from the test carrier 60 placed on the pocket 21. In the state with this temperature adjustment head 24 contacting the test carrier 60, the temperature sensor 241 measures the temperature of the die 90 during testing and the temperature of the die 90 is controlled by the heater 242 and the refrigerant in the flow path 243 on the basis of the measurement results. In the present embodiment, each of the test cells 20 individually comprises such a temperature adjustment head 24, so each of the test cells 20 are designed to be able to simultaneously and independently run tests of different temperatures.

In the present embodiment, when the test carrier 60 is placed in the pocket 21 by the later explained movement apparatus 38, the carrier 60 and the seal member 213 seal the recess 211. In this state, the vacuum pump 25 is operated to reduce the pressure inside the recess 211, then the test carrier 60 is pulled into the pocket 21 and the contactor 215 abuts against the external terminals 73 of the test carrier 60.

Note that, as shown in FIG. 10, instead of the vacuum pump 25, it is also possible to use a pushing head 26 to directly push the test carrier 60 from above and thereby make the contactors 215 abut the external terminals 73 of the test carrier 60.

Further, as shown in FIG. 11, the back surface of the board 22 of the test cell 20 may also be provided with a socket 27 enabling insertion/detachment of a test circuit 23. By exchanging test circuits 23 via the socket 27, for example, it is possible to replace the test circuit 23 in accordance with the type of the die 90 or increase the test cells 20 having test circuits for running long tests. Note that, the test circuits 23 may be replaced by hand or the test cell 20 may have a plurality of test circuits inside it for automatic replacement.

Further, instead of the socket 27, as shown in FIG. 12, it is also possible to mount a plurality of test circuits 23A to 23C with different test contents on the board 22 and, for example, use a relay or other switching device 28 to electrically switch the test circuits 23A to 23C connected to the contactors 215.

Figure 13:
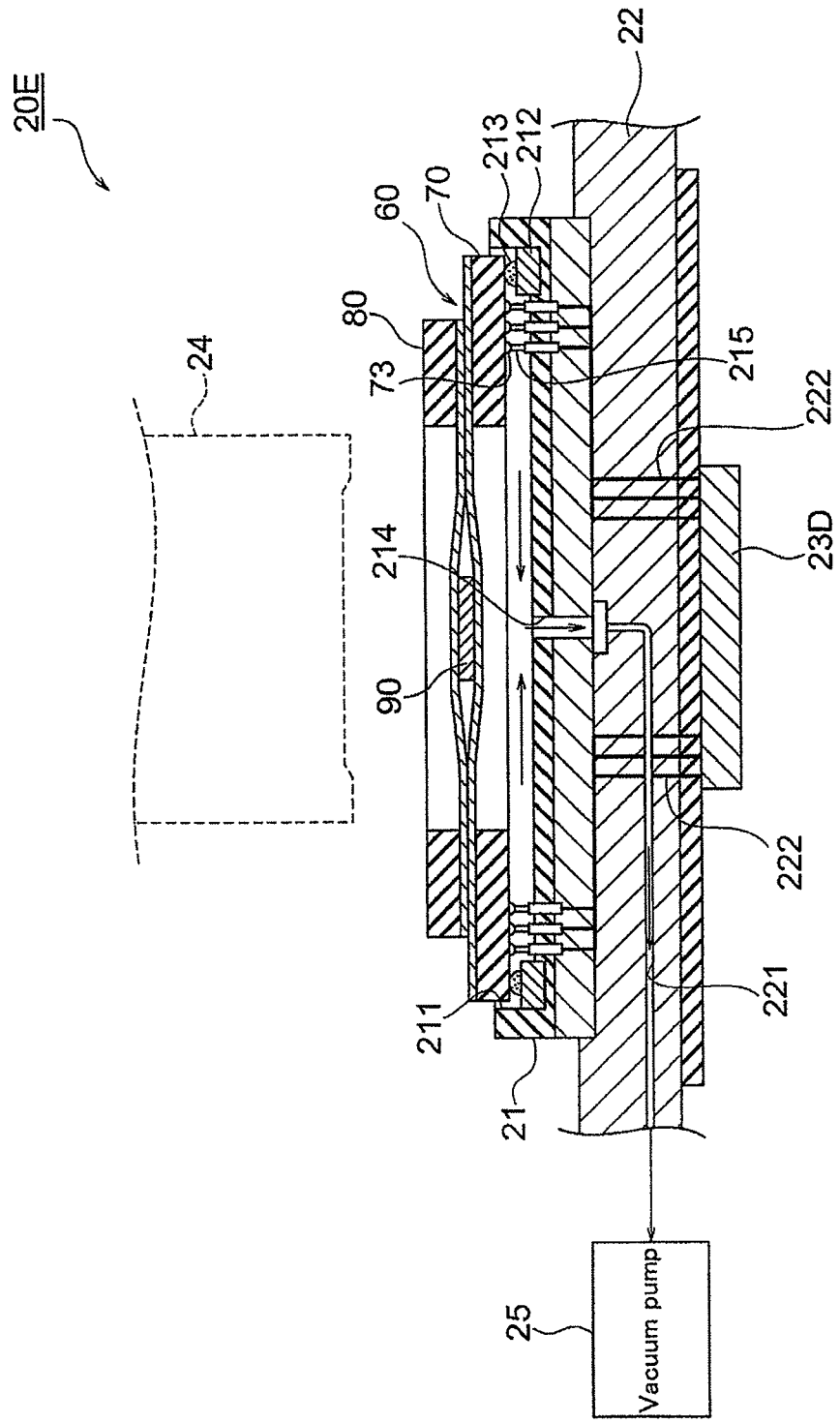
FIG. 13 is a cross-sectional view showing a fourth modification of a test cell in an embodiment of the present invention.

Further, as shown in FIG. 13, the test circuit 23 may be replaced with a repair-use circuit 23D. The repair-use circuit 23D in the present embodiment is a chip (repair-use chip) which replaces defective bits in a memory with redundant bits by applying voltage to electric fuses (e-FUSE circuit) in the electronic circuit to blow those fuses. Note that, a test cell 20E having this repair-use circuit 23D does not have to control the temperature of the die 90, so as shown in the same figure, no temperature adjustment head 24 is provided. Further, the repair-use circuit 23D is not limited to being configured by a single chip so long as of a form able to be accommodated in the test cell 20E. For example, it may also be configured by an MCM (multi-chip module) etc. Further, when part of the test cells 20E have such repair-use circuits 23D, the test circuits 23 of the other test cells 20D (see FIG. 22) have, in addition to the above-mentioned usual test functions, repair analysis functions of investigating the array of defective bits and planning for efficient replacement. Incidentally, the repair analysis requires more time than repair or post-repair tests.

Figure 14:
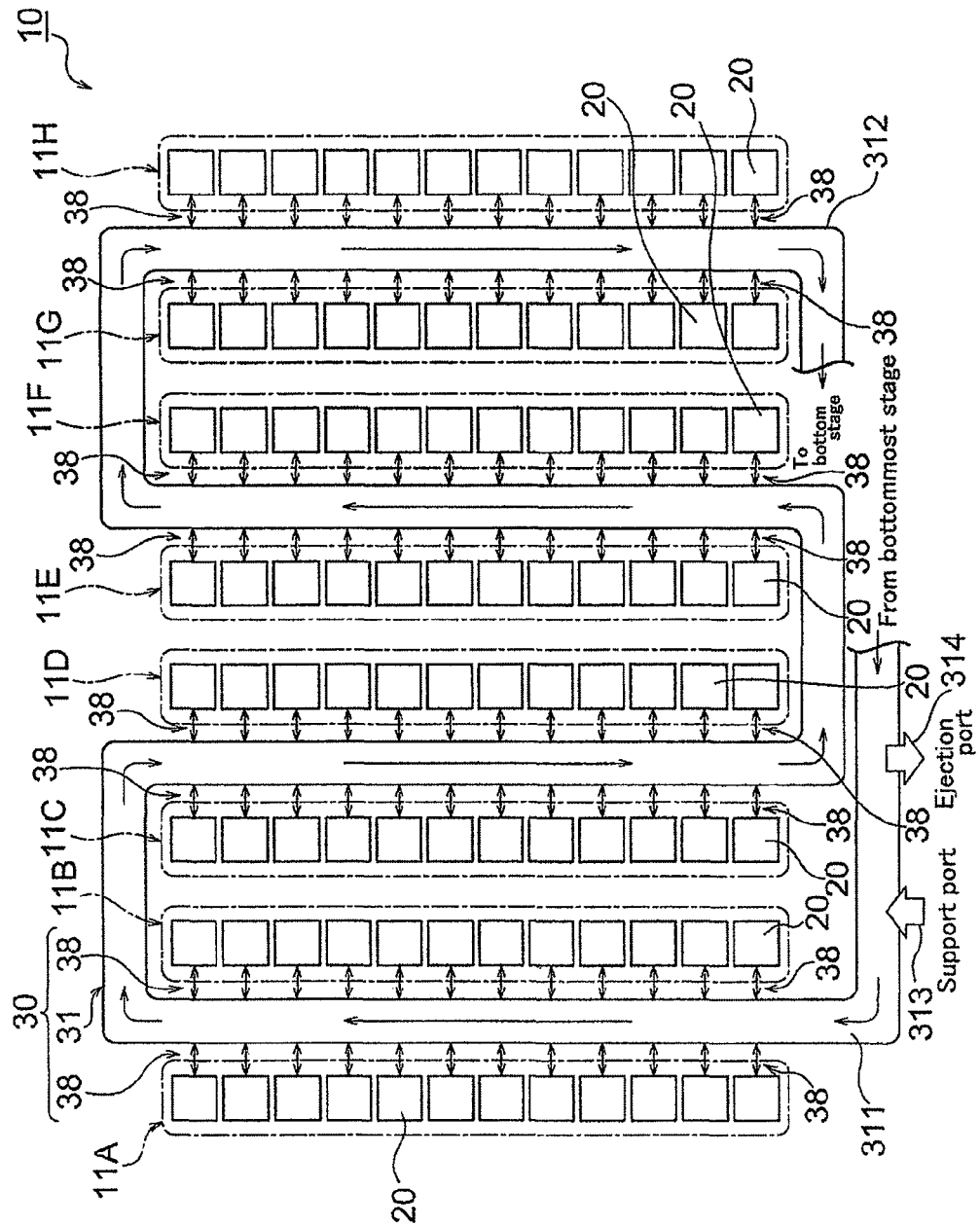
FIG. 14 is a plan view showing a test cell cluster and a conveyor apparatus in an embodiment of the present invention.
Figure 15:
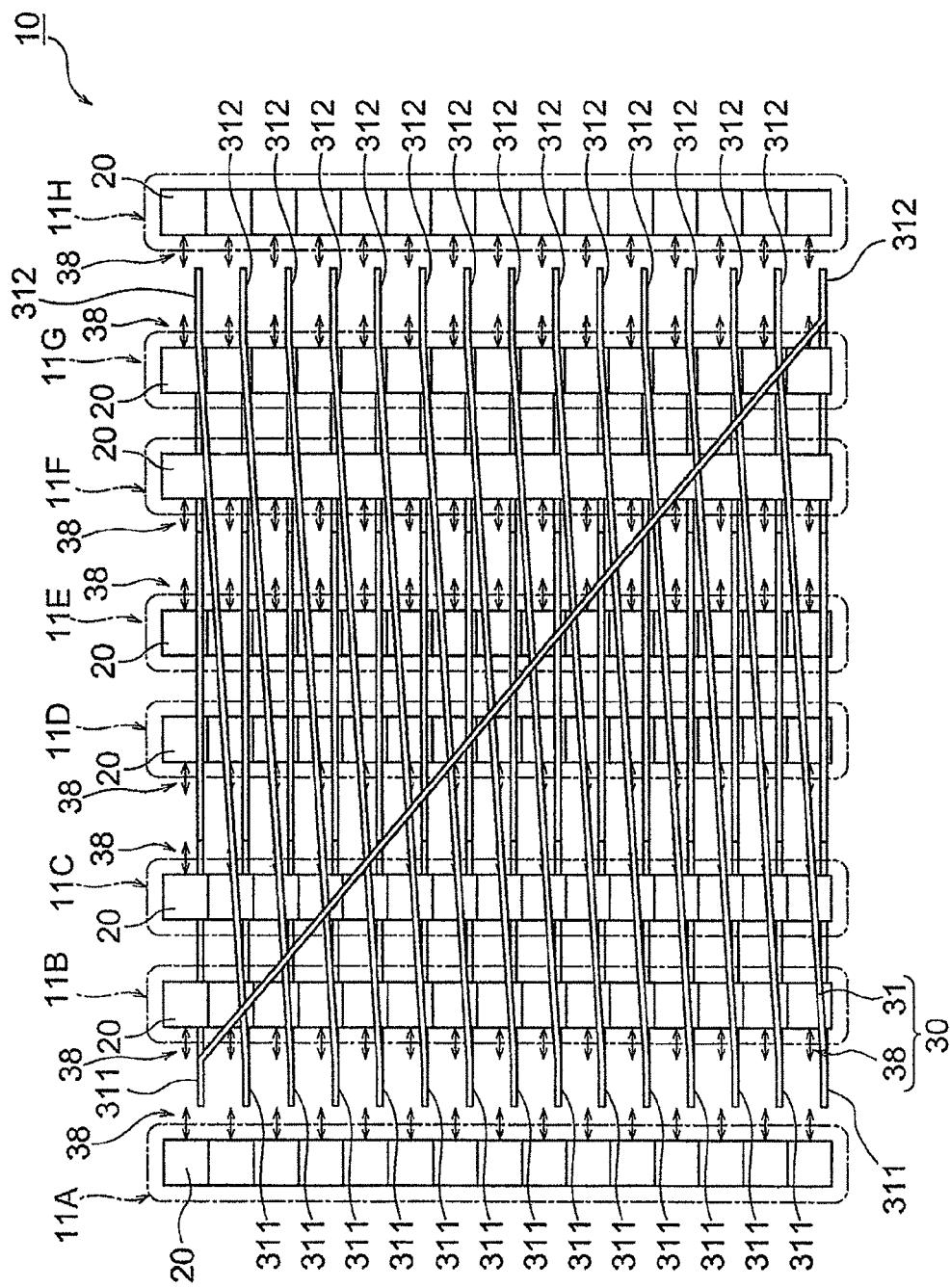
FIG. 15 is a front view of a test cell cluster and a conveyor apparatus in an embodiment of the present invention.

FIG. 14 and FIG. 15 are a plan view and a front view showing a test cell cluster and conveyor apparatus in the present embodiment, while FIG. 16 to FIG. 20 are views showing modifications of the conveyor apparatus.

As shown in FIG. 14 and FIG. 15, the conveyor apparatus 30 comprises: a circulating conveyor apparatus 31 which circulates and conveys test carriers 60 in the test cell cluster 10; and movement apparatuses 38 which move the test carriers 60 between the circulating conveyor apparatus 31 and the test cells 20.

The circulating conveyor apparatus 31 has for example a belt conveyor. As shown in FIG. 14 and FIG. 15, at each stage of the cell groups 11A to 11H, it snakes between the cell groups 11A to 11H. When reaching the end point 312 of each stage, it descends to the start point 311 of the one stage lower. At the final stage, it returns from the end point 312 to the start point 311 of the topmost stage.

The cell groups 11A to 11H are arranged to face each other across this circulating conveyor apparatus 31. Specifically, as shown in FIG. 14 and FIG. 15, the first cell group 11A and the second cell group 11B face each other across the circulating conveyor apparatus 31. Similarly, the third cell group 11C and fourth cell group 11D face each other across the circulating conveyor apparatus 31, the fifth cell group 11E and the sixth cell group 11F face each other across the circulating conveyor apparatus 31, and the seventh cell group 11G and the eighth cell group 11H face each other across the circulating conveyor apparatus 31.

Note that, the conveyance path of the circulating conveyor apparatus 31 is not particularly limited. For example, the circulating conveyor apparatus may pass through all test cells 20 of the first and second cell groups 11A and 11B, next, may pass through all test cells 20 of the third and fourth cell groups 11C and 11D, next, may pass through all test cells 20 of the fifth and sixth cell groups 11E and 11F, and finally may pass through all test cells 20 of the seventh and eighth cell groups 11G and 11H.

This circulating conveyor apparatus 31 is supplied with test carriers 60 at the supply port 313 from the previous step (for example, provisional packaging step S20 of FIG. 1). Further, this circulating conveyor apparatus 31 circulates and conveys the test carriers 60 between the test cells 20. A test carrier 60 of which all the tests at the test cells 20 are finished is taken out at the ejection port 314 from the circulating conveyor apparatus 31 and is ejected to the next step (for example, disassembly step S40 of FIG. 1).

The movement apparatus 38 is, for example, a robot arm which is able to pick up a rigid board 81 of the cover member 80 by suction and move the test carrier 60 three dimensionally (see FIG. 8). This movement apparatus 38 is provided between the circulating conveyor apparatus 31 and each of the test cells 20. In the present embodiment, the same number of movement apparatuses 38 as the test cells 20 is provided. Note that, a single movement apparatus 38 may be used to handle a plurality of test cells 20.

This movement apparatuses 38 pick up test carriers 60 from the circulating conveyor apparatus 31, move them to the insides of the test cells 20, and place them in the pockets 21. Further, after the dies 90 finish being tested, the movement apparatuses 38 take out the test carriers 60 from the pockets 21 and return them to the circulating conveyor apparatus 31. A test carrier 60 finished being tested at one test cell 20 in this way is conveyed by the circulating conveyor apparatus 31 and supplied to another test cell 20 for the next test or ejected to the next step via the ejection port 314.

Figure 16:
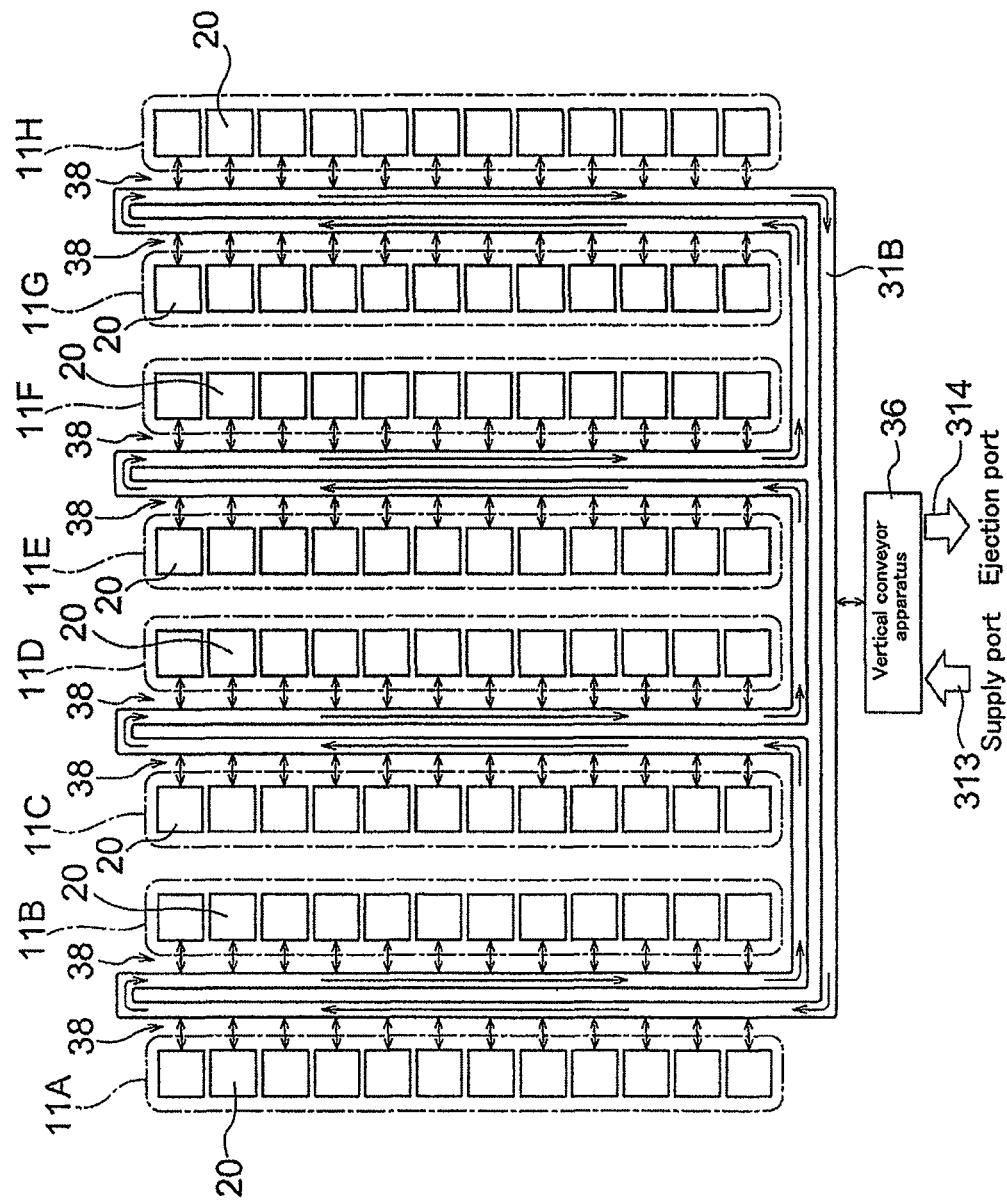
FIG. 16 is a plan view of a first modification of a conveyor apparatus in an embodiment of the present invention.

Note that, as shown in FIG. 16, it is also possible to provide independent circulating conveyor apparatuses 31B for the different stages of the cell groups 11A to 11H and use a vertical conveyor apparatus 36 to transfer test carriers 60 between the circulating conveyor apparatuses 31B.

Figure 17:
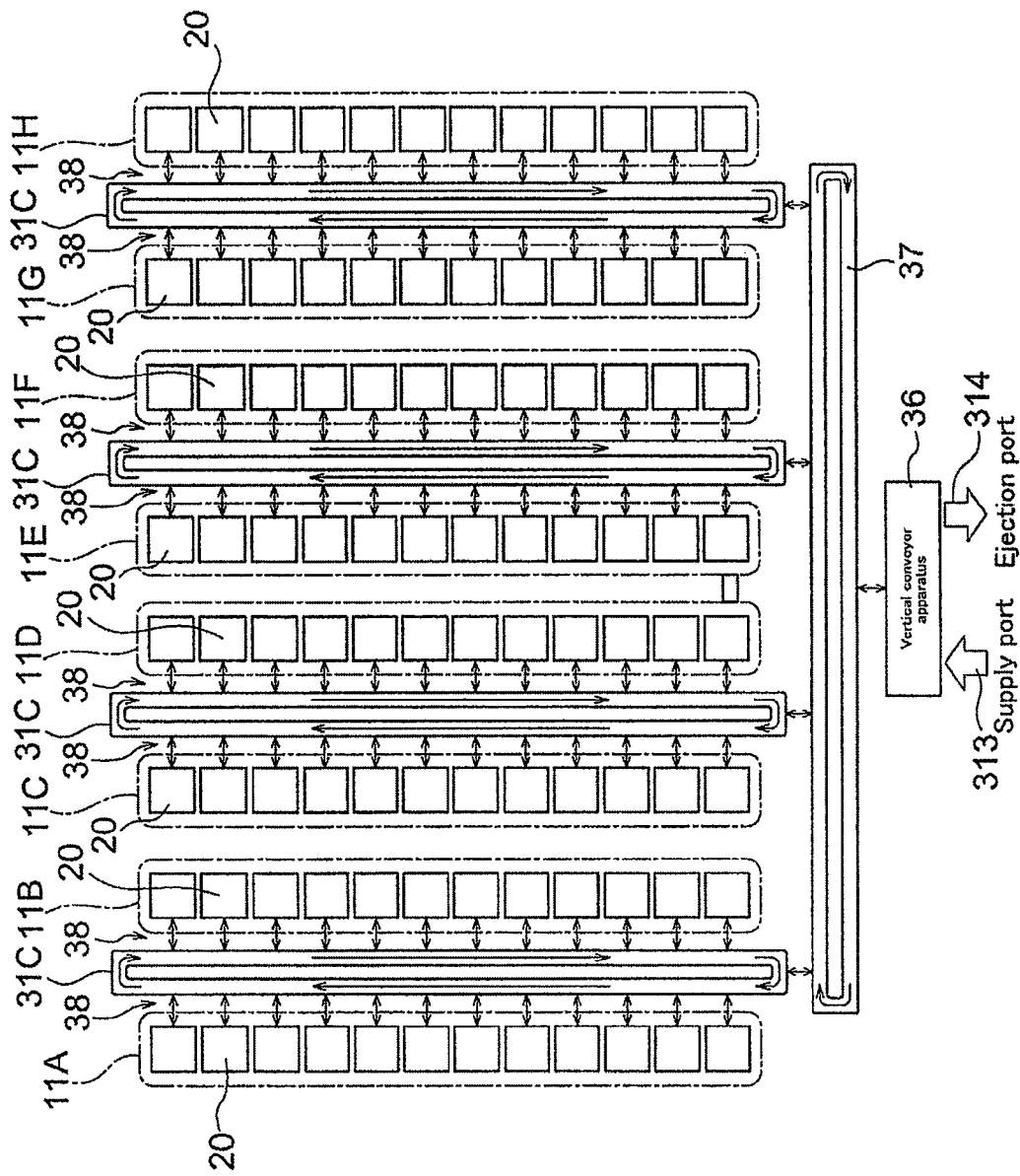
FIG. 17 is a plan view of a second modification of a conveyor apparatus in an embodiment of the present invention.

Alternatively, as shown in FIG. 17, it is also possible to provide independent conveyor apparatuses 31C for the different stages and different columns of the cell groups 11A to 11H and use a common conveyor apparatus 37 at each of the stages to transfer test carriers 60 between circulating conveyor apparatuses 31C. Furthermore, the vertical conveyor apparatus 36 may be used to transfer test carriers 60 between the common conveyor apparatuses 37.

Figure 18:
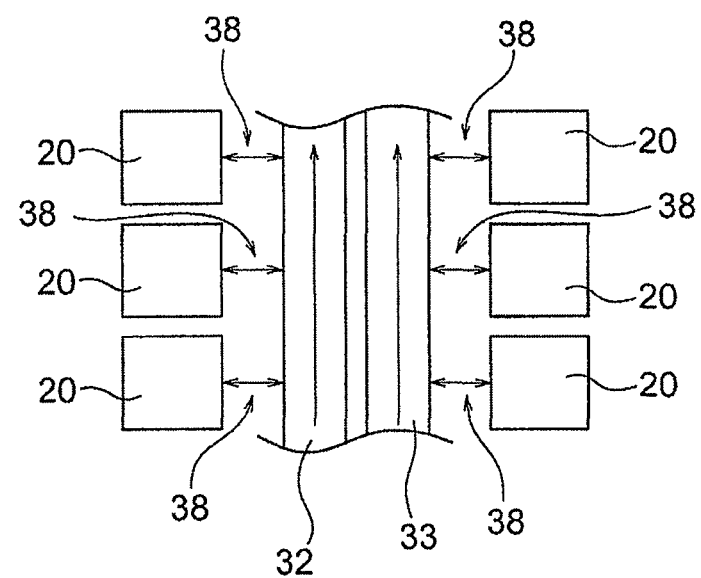
FIG. 18 is an enlarged plan view of a third modification of a conveyor apparatus in an embodiment of the present invention.

Further, in the example shown in FIG. 14 and FIG. 15, the circulating conveyor apparatus 31 only has a single conveyance path, but the invention is not particularly limited to this. For example, as shown in FIG. 18, the circulating conveyor apparatus may have a plurality of (in the example shown in FIG. 18, two) conveyance paths 32 and 33. Due to this, it is possible to suppress the occurrence of jams of the test carriers 60. At this time, the first conveyance path 32 may be the exclusive supply path for the test carriers 6 to the test cells 20, while the second conveyance path 33 may be the exclusive ejection path of the test carriers 60 from the test cells 20.

Figure 19:
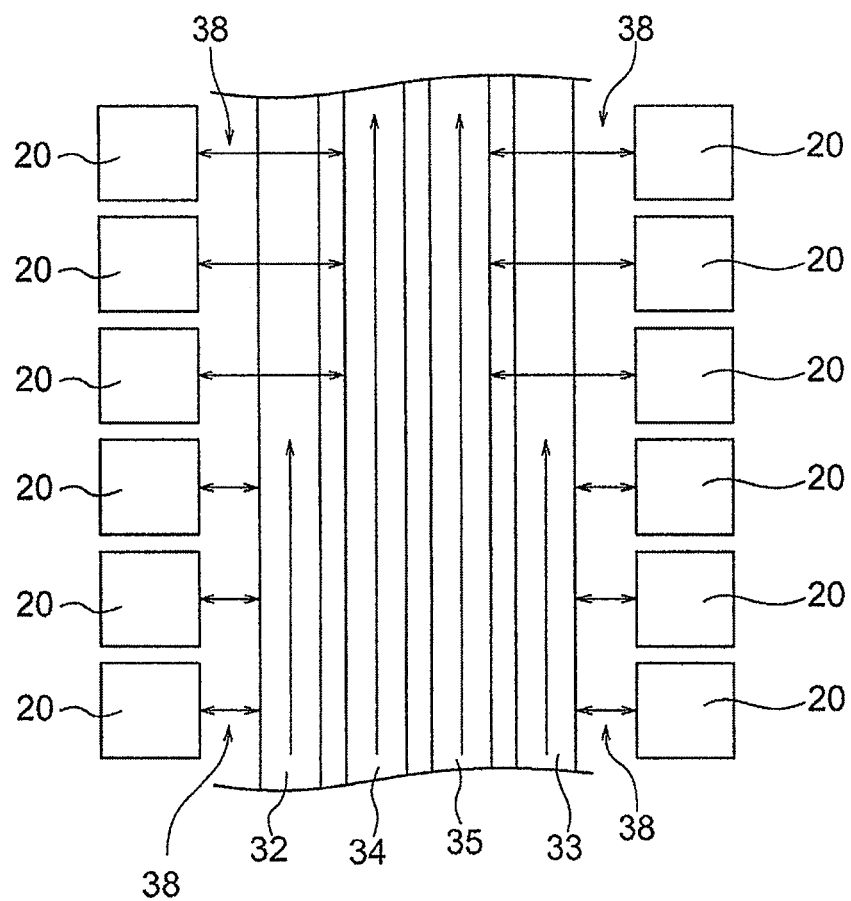
FIG. 19 is an enlarged plan view of a fourth modification of a conveyor apparatus in an embodiment of the present invention.

Alternatively, as shown in FIG. 19, the first and second conveyance paths 32 and 33 may supply test carriers 60 to the front (the bottom six in the figure) test cells 20, while the third and fourth conveyance paths 34 and 35 may supply test carriers 60 to the back (the top six in the figure) test cells 20. By utilizing the third and fourth conveyance paths 34 and 35 as passing lanes in this way, it is possible to better suppress jams of the test carriers 60. Note that, movement apparatuses for moving the test carriers 60 between a plurality of the conveyance paths 32 to 35 may also be provided.

Figure 20:
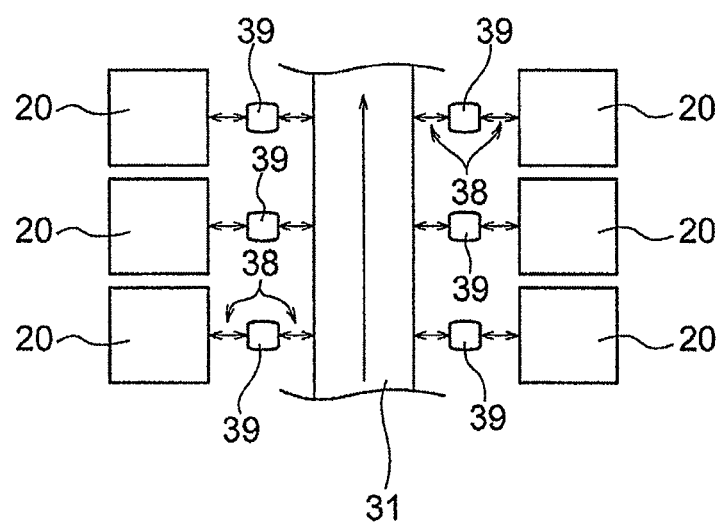
FIG. 20 is an enlarged plan view of a fifth modification of a conveyor apparatus in an embodiment of the present invention.

Furthermore, as shown in FIG. 20, the conveyor apparatus 30 may comprise buffers 39 corresponding to the respective test cells 20. The movement apparatuses 38 move the test carriers 60 conveyed by the circulating conveyor apparatus 31 to the buffers 39 and the buffers 39 temporarily store the test carriers 60 so as to enable the next test carriers 60 to be immediately supplied after the end of testing at the test cells 20.

Note that, the above-mentioned conveyor apparatus 30 is only one example. The conveyor apparatus of the present invention is not particularly limited. For example, instead of the circulating conveyor apparatus 31 and movement apparatus 38, the conveyor apparatus 30 as a whole may be configured by, for example, a plurality of robot arms. In this case, the robot arms can simultaneously hold a plurality of test carriers 60, so the same function as the above-mentioned buffers 39 can be secured.

The control device 40 controls the conveyor apparatus 30 and controls the respective test cells 20.

For example, the control device 40 can control the plurality of test cells 20 to simultaneously run tests. At this time, the plurality of test cells 20 may run tests of the same contents or may run tests of different contents.

Further, the control device 40 is designed to be able to control the adjustment of temperature at a plurality of test cells 20, so for example, can run tests of mutually different temperature conditions at a plurality of test cells 20.

Further, the control device 40 is designed to be able to search for empty test cells 20 to which test carriers are not supplied in the test cell cluster 10. Further, the control device 40 controls the conveyor apparatus 30 so as to preferentially supply test carriers 60 to the empty test cells 20. Due to this, the operating rates of the test cells 20 can be improved.

Note that, when the conveyor apparatus 30 has buffers 39 such as shown in FIG. 20, the control device 40 may search for empty buffers 39 to which test carriers 60 are not supplied and control the conveyor apparatus 30 so as to preferentially supply test carriers 60 to those empty buffers 39.

Further, the control device 40 may predict empty test cells 20 on the basis of the remaining test times at the test cells 20 in the middle of testing. In this case, the control device 40 controls the conveyor apparatus 30 so as to start the supply of test carriers 60 to the test cells 20 earlier by exactly the time corresponding to the remaining test times (that is, to cancel out the remaining test times by the conveyance times).

Furthermore, in the present embodiment, the control device 40 controls the conveyor apparatus 30 so as to successively convey the same test carrier 60 to a plurality of test cells 20 in order to successively run through tests on the same die 90 at a plurality of test cells 20. Due to this, a single electronic device test apparatus 1 can run a plurality of tests on the same die 90.

Note that the respective test cells 20 may also control the movement apparatus 38. In this case, the circulating conveyor apparatus 31 endlessly circulates test carriers 60, while the test cells 20 use the movement apparatuses 38 to autonomously obtain test carriers 60 from the circulating conveyor apparatus 31 after finishing testing the dies 90.

Figure 21:
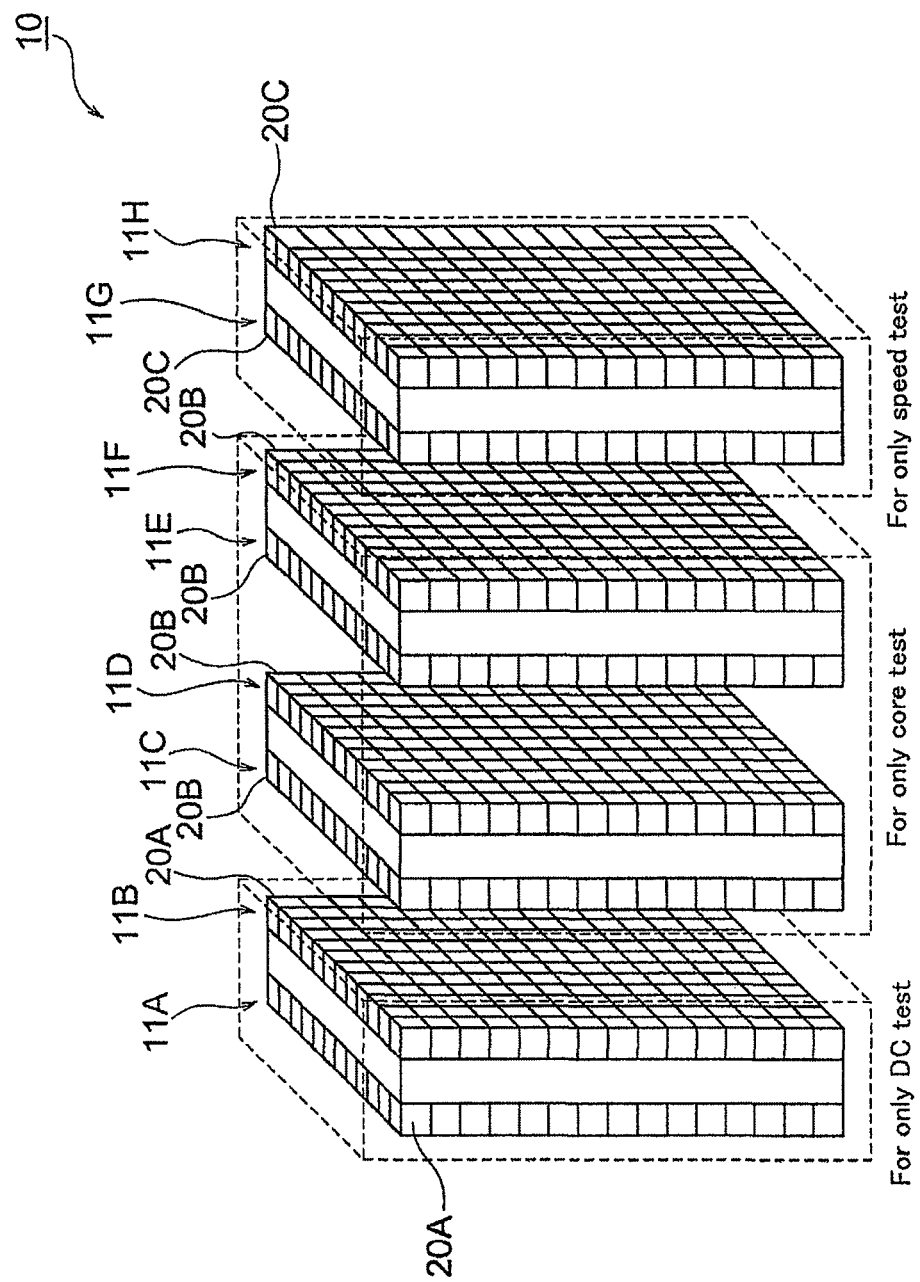
FIG. 21 is a schematic view showing an example of a combination of test cells in an embodiment of the present invention.
Figure 22:
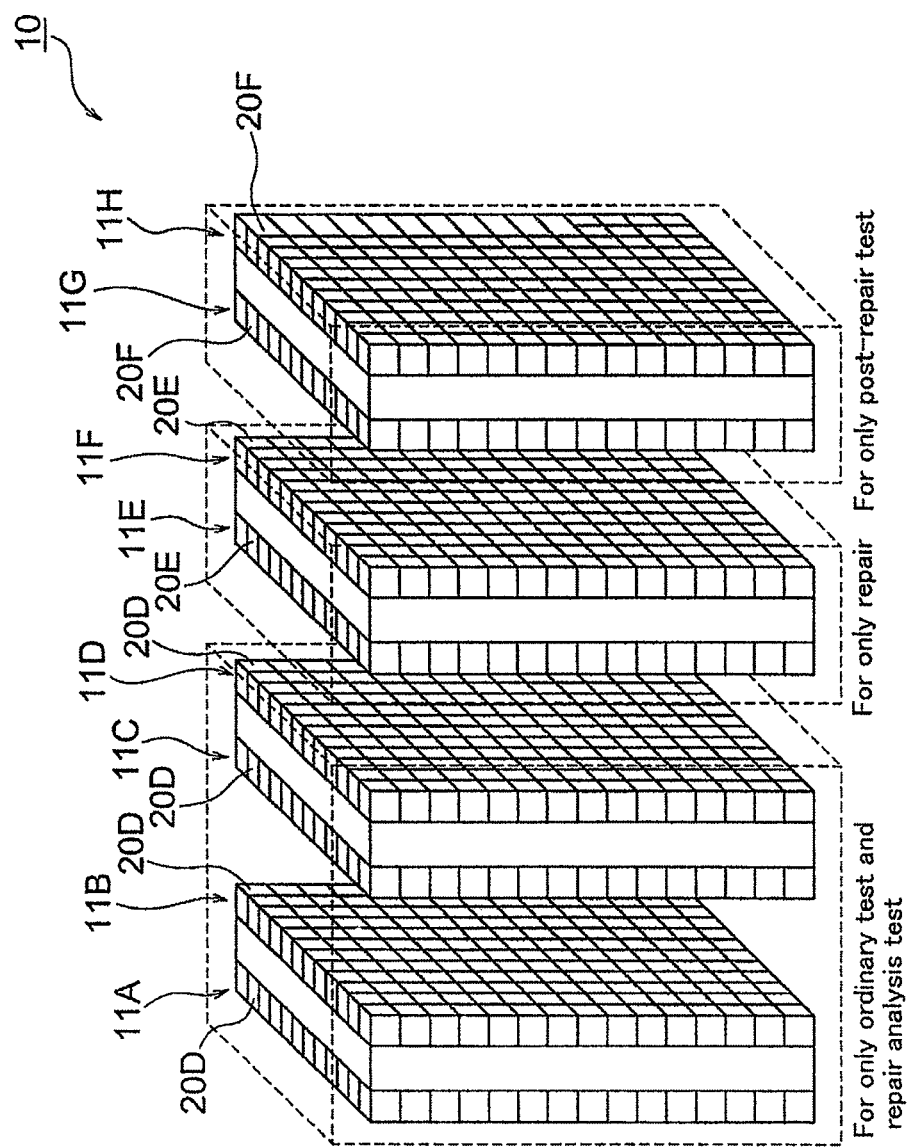
FIG. 22 is a schematic view showing another example of a combination of test cells in an embodiment of the present invention.

FIG. 21 and FIG. 22 are schematic views showing examples of combinations of test cells in the present embodiment.

For example, as shown in FIG. 21, the first and second cell groups 11A and 11B may have test cells 20A specialized DC test, the third to sixth cell groups 11C to 11F may have test cells 20B specialized core test, the seventh and eighth cell groups 11G and 11H may have test cells 20C specialized speed test, and the same die 90 may be run through three types of tests in the order of a DC test, core test, and speed test.

At this time, as already explained, the core test is much longer in test time than a DC test and a speed test, so in the present embodiment, about double the core test-use test cells 20B are provided in comparison with the DC test-use test cells 20A and the speed test-use test cells 20C. Due to this, the core test which is the bottleneck step can be improved in efficiency, and the waiting time of the other test cells 20A and 20C can be reduced, so the operating rate of the electronic device test apparatus 1 can be improved.

At this time, the control device 40 may control the conveyor apparatus 30 so as to not to supply dies 90 judged defective by the DC test to the specialized core test-use test cells 20B, but to eject them from the ejection port 314. Due to this, the efficiency of the core test can be further improved. Note that by setting the order of the tests in the order of the greater frequency of occurrence of defects, it is possible to further improve the operating rate of the electronic device test apparatus 1.

Further, for example, as shown in FIG. 22, the first to fourth cell groups 11A to 11D may have ordinary test and repair analysis-use test cells 20D, the fifth and sixth cell groups 11E and 11F may have repair-use test cells 20E, the seventh and eighth cell groups 11G and 11H may have post-repair test-use test cells 20F, and the same die 90 may be run through an ordinary test and repair analysis, repair, and post-test repair.

At this time, as already explained, repair analysis requires longer time than that repair or the post-repair tests, so in the present embodiment, about double the ordinary test and repair analysis-use test cells 20D are provided in comparison with the repair-use test cells 20E and the post-repair test-use test cells 20F. Due to this, repair analysis which is the bottleneck step can be improved in efficiency, and the waiting time of other test cells 20E and 20F can be reduced, so the operating rate of the electronic device test apparatus 1 can be improved.

As explained above, in the present embodiment, the test carriers 60 are conveyed by the conveyor apparatus 30 to the test cells 20, and the test cells 20 individually test the dies 90, so it is possible to keep the throughput while reducing the costs.

In particular, in the present embodiment, by changing the test circuits of the test cells 20, it is possible to freely put together test contents and possible to freely put together tests under different temperature conditions, so it is possible to use a single electronic device test apparatus 1 to run a plurality of tests and possible to reduce the costs.

Further, in the present embodiment, by making the test circuits 23 specialized chips for specific tests, it is possible to further reduce the costs.

Furthermore, in the present embodiment, by changing the breakdown of the test cells 20 in accordance with the test time, it is possible to reduce the waiting time of the test cells 20 and possible to improve the operating rate of the electronic device test apparatus 1.

Note that the embodiments explained above were described for facilitating understanding of the present invention and were not described for limiting the present invention. Therefore, the elements disclosed in the above embodiments include all design modifications and equivalents falling under the technical scope of the present invention.

REFERENCE SIGNS LIST

1 . . . electronic device test apparatus
10 . . . test cell cluster
11A to 11H . . . cell groups
20 . . . test cell
20A . . . DC test-use test cell
20B . . . core test-use test cell
20C . . . speed test-use test cell
20D . . . ordinary test and repair analysis-use test cell
20E . . . repair-use test cell
20F . . . post-repair test-use test cell
21 . . . pocket
211 . . . recess
213 . . . seal member
214 . . . suction port
215 . . . contactor
22 . . . board
221 . . . flow path
222 . . . interconnect pattern
23 . . . test circuit
24 . . . temperature adjustment head
25 . . . vacuum pump
30 . . . conveyor apparatus
31 . . . circulating conveyor apparatus
38 . . . movement apparatus
40 . . . control device
60 . . . test carrier
70 . . . base member
73 . . . external terminal
80 . . . cover member
90 . . . die (electronic device)
91 . . . terminal

The invention claimed is:

1. An electronic device test apparatus for testing electronic devices temporarily held in test carriers, the apparatus comprising:
test cells comprising test circuits;
a conveyor configured to convey the test carriers to the test cells; and
a controller configured to control the test cells and the conveyor, wherein
each of the test cells can hold one of the test carriers,
each of the test cells has:
at least one contact terminal;
a contactor configured to bring at least one external terminal of the test carrier and the at least one contact terminal into contact; and
a corresponding one of the test circuits which electrically connects to the at least one contact terminal and runs at least one test on the electronic device,
each of the test carriers holds one of the electronic devices,
each of the test carriers comprises:
a base member having the at least one external terminal and on which the electronic device is placed;
a cover member which covers the base member; and
at least one interconnect which electrically connects the at least one external terminal and at least one device terminal of the electronic device, wherein at least one of the base member or the cover member has a deformable layer, the electronic device is sandwiched between the base member and the cover member, the deformable layer is in contact with the electronic device, and the controller controls the test cells so that the test cells run tests independently from each other.

2. The electronic device test apparatus as set forth in claim 1, wherein the test cells are provided in, wherein the test cells in each of the test cell groups are arranged in a matrix.

3. The electronic device test apparatus as set forth in claim 2, wherein the test cell groups are arranged so as to face each other via the conveyor.

4. The electronic device test apparatus as set forth in claim 1, wherein the test cells at least include:

first test cells each of which has a first test circuit configured to run a first test; and second test cells each of which has a second test circuit configured to run a second test with a longer test time than the first test.

5. The electronic device test apparatus as set forth in claim 4, wherein the test cells include a larger number of the second test cells than the first test cells.

6. The electronic device test apparatus as set forth in claim 1, wherein at least one of the test cells has a recovery-use circuit configured to cut an electric fuse of the electronic device instead of the test circuit.

7. The electronic device test apparatus as set forth in claim 1, wherein each of the test circuits is able to run a plurality of types of tests.

8. The electronic device test apparatus as set forth in claim 1, wherein the conveyor has:

a circulating conveyor configured to circulate and convey the test carriers; and movers configured to move the test carriers between the circulating conveyor and the test cells.

9. The electronic device test apparatus as set forth in claim 1, wherein the conveyor has a circulating conveyor configured to circulate and convey the test carriers, and each of the test cells has a mover configured to move the test carrier from the circulating conveyor.

10. The electronic device test apparatus as set forth in claim 8, wherein the circulating conveyor has a plurality of conveyance paths.

11. The electronic device test apparatus as set forth in claim 9, wherein the circulating conveyor has a plurality of conveyance paths.

12. The electronic device test apparatus as set forth in claim 1, wherein the contactor includes a pressure reducer configured to reduce the pressure in the space between a board on which the at least one contact terminal is mounted and a test carrier so as to bring the at least one contact terminal and the at least one external terminal into contact.

13. The electronic device test apparatus as set forth in claim 1, wherein the contactor includes a pusher configured to push the test carrier toward the at least one contact terminal so as to bring the at least one contact terminal and the at least one external terminal into contact.

14. The electronic device test apparatus as set forth in claim 1, wherein each of the test cells has a temperature adjuster configured to adjust the temperature of the electronic device, and the controller controls the test cells so that the test cells adjust the temperatures of the electronic devices independently from each other.

15. The electronic device test apparatus as set forth in claim 1, wherein the controller controls the conveyor so as to successively convey the same test carrier to the test cells.

16. The electronic device test apparatus as set forth in claim 15, wherein the controller controls the conveyor so as not to supply the test carrier which holds the electronic device judged defective at one of the test cells to other of the test cells.

17. The electronic device test apparatus as set forth in claim 1, wherein the controller searches for at least one empty test cell to which the test carrier is not supplied and controls the conveyor so as to preferentially supply the test carrier to the at least one empty test cell.

18. The electronic device test apparatus as set forth in claim 1, wherein the controller controls the conveyor so as to start the supply of the test carrier to the test cells on the basis of the remaining test times at the test cells under test.

19. The electronic device test apparatus as set forth in claim 1, the apparatus comprises buffers each of which temporarily stores the test carrier between the conveyor and each of the test cells.

20. The electronic device test apparatus as set forth in claim 19, wherein the controller searches for at least one empty buffer not storing the test carrier and controls the conveyor so as to preferentially supply the test carriers to the at least one empty buffer.

21. The electronic device test apparatus as set forth in claim 1, wherein at least one of the test cells has:

a plurality of the test circuits; and a switch configured to select the test circuit to be electrically connected to the contact terminals from among the plurality of test circuits.

22. The electronic device test apparatus as set forth in claim 1, wherein at least one of the test cells has a socket to which the test circuit is able to be attached and detached.

23. The electronic device test apparatus as set forth in claim 1, wherein the electronic device is a die which is formed by dicing a semiconductor wafer.

* * * * *